United States Patent
Isogai et al.

(10) Patent No.: US 6,328,362 B1
(45) Date of Patent: Dec. 11, 2001

(54) ELECTRIC-COMPONENT MOUNTING HEAD

(75) Inventors: Takeyoshi Isogai, Hekinan; Hiroshi Katsumi, Chiryu; Noriaki Iwaki, Hekinan, all of (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 0 days.

(21) Appl. No.: 09/624,859

(22) Filed: Jul. 24, 2000

(30) Foreign Application Priority Data

Aug. 5, 1999 (JP) ................................... 11-222836

(51) Int. Cl.[7] ................................ B25J 15/06; B66C 1/02
(52) U.S. Cl. ..................... 294/64.1; 29/740; 414/752.1; 901/40
(58) Field of Search .................. 294/64.1, 2; 901/40; 414/737, 752.1; 29/740, 741, 743, DIG. 44; 279/3

(56) References Cited

U.S. PATENT DOCUMENTS

| | | | |
|---|---|---|---|
| 4,266,905 | * 5/1981 | Birk et al. | 294/64.1 |
| 4,432,701 | * 2/1984 | Ise | 417/187 |
| 4,657,470 | * 4/1987 | Clarke et al. | 294/64.1 |
| 4,703,965 | * 11/1987 | Lee et al. | 294/64.1 |
| 4,850,780 | * 7/1989 | Safabakhsh et al. | 294/64.1 |
| 4,950,011 | * 8/1990 | Borcea et al. | 294/64.1 |
| 5,029,383 | 7/1991 | Snyder et al. | 294/64.1 |
| 5,195,235 | * 3/1993 | Mifuji | 29/743 |
| 5,201,875 | * 4/1993 | Tessier et al. | 29/743 |
| 5,308,132 | 5/1994 | Kirby et al. | 318/568.12 |
| 5,420,488 | 5/1995 | Gutman | 294/64.1 |
| 5,626,378 | * 5/1997 | Puhl et al. | 294/64.1 |
| 5,657,533 | * 8/1997 | Fukui et al. | 294/64.1 |
| 5,758,410 | 6/1998 | Asai et al. | 29/740 |
| 5,850,683 | * 12/1998 | Okazaki et al. | 294/64.1 |
| 6,012,222 | * 1/2000 | Asai et al. | 29/743 |
| 6,043,458 | * 3/2000 | Fortune | 294/64.1 |
| 6,101,707 | * 8/2000 | Kano et al. | 29/740 |
| 6,161,886 | * 12/2000 | Furuya et al. | 294/64.1 |

FOREIGN PATENT DOCUMENTS

| | | |
|---|---|---|
| 63-55800 | 11/1988 | (JP). |
| 405077186 | * 3/1993 | (JP). |
| 411261295 | * 9/1999 | (JP). |

* cited by examiner

*Primary Examiner*—Eileen D Lillis
*Assistant Examiner*—Paul T. Chin
(74) *Attorney, Agent, or Firm*—Oliff & Berridge, PLC

(57) ABSTRACT

An electric-component mounting head, including a support member, a suction nozzle which applies a suction to an electric component and thereby holds the component, and a nozzle holder which is supported by the support member, which holds the nozzle such that the nozzle is movable relative to the support member in a direction parallel to an axis line of the nozzle, and which comprises a housing and a piston fitted in the housing such that one of the housing and the piston that is connected to the nozzle is movable relative to the other of the housing and the piston that is connected to the support member, the nozzle holder having at least one pressure chamber which is defined by at least one of axially opposite end surfaces of the piston and the housing, at least one communication opening which communicates with the one pressure chamber, two guide surfaces which are supported by the housing and the piston, respectively, and cooperate with each other to guide the relative movement of the housing and the piston, and a gas-supply passage which opens in a space provided between the two guide surfaces, at at least two positions axis-symmetric with each other with respect to an axis line of the piston, and supplies a pressurized gas to the space.

17 Claims, 8 Drawing Sheets

ELECTRIC-COMPONENT MOUNTING HEAD

BACKGROUND OF INVENTION

1. Field of Invention

The present invention relates to an electric-component mounting head which is employed in an electric-component mounting apparatus and particularly to the art of controlling a mounting load as a pressing load with which an electric component (e.g., an electronic component) is pressed against an object (e.g., a printed wiring board) when the electric component is mounted on the object.

2. Related Art Statement

FIG. 8 schematically shows a conventional electric-component ("EC") mounting head 100. The EC mounting head 100 includes (a) a support member 102, (b) a suction nozzle 104 which applies a suction to an EC and thereby holds the EC, (c) a ball spline 106 which connects the suction nozzle 104 to the support member 102 such that the nozzle 104 is movable relative to the support member 102 in a direction parallel to an axis line of the nozzle 104, and (d) a coil spring 108 which biases the suction nozzle 104 in a downward direction. The ball spline 106 includes a ball-spline axis member 110 fixed to the support member 102, and a ball-spline nut 112 fitted on the axis member 110 via balls. The suction nozzle 104 is held by the nut 112, and is biased by the coil spring 108 via the nut 112. The support member 102 is elevated and lowered by an elevating and lowing device (not shown).

Before the EC mounting head 100 starts an EC mounting operation, a relationship between the position of the suction nozzle 104 relative to the support member 102 and the downward force applied to the nozzle 104 is determined and, based on the thus determined relationship, a desired position to which the support member 102 is moved downward by the elevating and lowering device is determined. More specifically described, a contact sensor 114 detects a "contact" position of the support member 102 where the EC held by the suction nozzle 104 contacts an object (e.g., a printed wiring board, "PWB"), and a control device (not shown) controls, according to the determined relationship, an amount of downward movement (i.e., a downward stroke) of the support member 102 from the detected "contact" position, so that a desired downward force may be applied to the suction nozzle 104 and accordingly the EC held by the nozzle 104 may be mounted on the object with a desired mounting load. Thus, the conventional EC mounting head 100 essentially needs, for pressing an EC against an object with an appropriate load, the determination of a relationship between the position of the suction nozzle 104 relative to the support member 102 and the downward force applied to the nozzle 104, and an accurate control of downward stroke of the support member 102.

In addition, a minimal mounting load of the conventional EC mounting head 100 mainly depends on (1) the total weight of the suction nozzle 104 and one or more members which is or are moved as a unit with the nozzle 104, (2) an elastic force of the coil spring 108 when the support member is moved downward to, and stopped at, the desired position, and (3) a resistance to the relative movement between the ball-spline axis member 110 and the ball-spline nut 112. Thus, it has been difficult to sufficiently decrease the minimal mounting load.

SUMMARY OF INVENTION

The present invention provides an electric-component mounting head which has one or more of the following technical features that are described in below in respective paragraphs given parenthesized sequential numbers (1) to (8). Any technical feature which includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, but not all) of those items.

(1) According to a first feature of the present invention, there is provided an electric-component mounting head, comprising a support member; a suction nozzle which applies a suction to an electric component and thereby holds the electric component; and a nozzle holder which is supported by the support member, which holds the suction nozzle such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having at least one pressure chamber which is defined by at least one of axially opposite end surfaces of the piston and the housing, at least one communication opening which communicates with the at least one pressure chamber, two guide surfaces which are supported by the housing and the piston, respectively, and cooperate with each other to guide the relative movement of the housing and the piston, and a gas-supply passage which opens in a space provided between the two guide surfaces, at at least two positions axis-symmetric with each other with respect to an axis line of the piston, and supplies a pressurized gas to the space.

In the above EC mounting head, the two guide surfaces may be formed on the piston and the housing, respectively, or on a piston rod connected to the piston, and the housing, respectively. Since the space provided between the two guide surfaces is supplied with the pressurized gas, the two guide surfaces cooperate with each other to provide a gas bearing. Therefore, the resistance to the relative movement between the piston and/or the piston rod and the housing can be decreased to a negligibly small value. The suction holder may have either one or two pressure chambers. In the case where a pressure controller which controls a pressure of a gas supplied to the one air chamber is connected to the communication opening and a gas supplying device is connected to the air-supply passage, the present EC mounting head is readable on the following EC mounting head including the mounting-load control device in accordance the second feature (2).

(2) According to a second feature of the present invention, there is provided an electric-component mounting head, comprising a support member, a suction nozzle which applies a suction to an electric component and thereby holds the electric component, and a mounting-load control device which controls a mounting load with which the suction nozzle presses the electric component against an object when the suction nozzle mounts the electric component on the object, the mounting-load control device including a nozzle holder which connects the suction nozzle to the support member such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having at least one pressure chamber which is defined by at least one of axially opposite end surfaces of the piston and the housing, and having two guide surfaces which are supported by the housing and the piston, respectively, and cooperate with each other to guide the relative movement of the housing and the piston, and a pressure controller which controls a pressure of a gas which is supplied to the one pressure chamber of the nozzle holder.

The present EC mounting head enjoys the advantage that the mounting load does not change when the relative position between the support member and the suction nozzle changes. That is, the mounting load can be maintained at a desired value when the height position of the support member changes. Moreover, the pressure in the pressure chamber can be detected, and the mounting load can be determined based on the detected pressure and a weight of the suction nozzle that is known in advance. Therefore, the present EC mounting head can easily and accurately control the mounting load without directly detecting the load. A pressure chamber may be one whose pressure is controlled or changed, one whose pressure is maintained at a constant value, or one which is always communicated with the atmosphere. In the case where the suction holder has only one pressure chamber, the pressure of the pressure chamber is controlled; and in the case where the suction holder has two pressure chambers, the pressure of at least one of the two pressure chambers is controlled. In the latter case, the pressure chamber whose pressure is not controlled may be one which is always communicated with the atmosphere and accordingly is maintained at the atmospheric pressure, or one which is supplied with a gas from a gas source so as to be maintained at a constant pressure. The gas source may be one which is connected to the pressure controller, or one which belongs to a gas supplying device which supplies a gas to the space provided between the two guide surfaces.

(3) According to a third feature of the present invention that includes the second feature (2), the mounting head further comprises a gas supplying device which supplies a gas to a space provided between the two guide surfaces of the nozzle holder, and the gas supplying device and the two guide surfaces cooperate with each other to provide a gas bearing.

In a conventional EC mounting head, a suction nozzle is supported by a support member via a rolling bearing. However, it is difficult to sufficiently decrease, or sufficiently even, the resistance to the relative movement between the suction nozzle and the support member via the rolling bearing. Thus, it has been difficult to sufficiently decrease the magnitude of the mounting load or sufficiently decrease the variation of the mounting load. In contrast, the present EC mounting head in accordance with the third feature (3), the space provided between the two guide surfaces is supplied with the gas to form the gas bearing, and accordingly the resistance to the relative movement of the piston and the housing is decreased to a negligibly small value. Thus, the present head can mount an EC on an object with a very small mounting load, or a very small variation of the mounting load. A gas source which supplies a pressurized gas to the pressure chamber via the pressure controller, and a gas source of the gas supplying device may be provided by two exclusive ones, or a single, common one.

(4) According to a fourth feature of the present invention that includes the second or third features (2) or (3), the nozzle holder comprises, as the one pressure chamber, a first pressure chamber which is defined by the one of the opposite end surfaces of the piston and the housing, and additionally comprises a second pressure chamber which is defined by the other end surface of the piston and the housing, and the pressure controller controls each of the pressure of the gas supplied to the first pressure chamber and a pressure of a gas supplied to the second pressure chamber.

In the present EC mounting head, the respective pressures of the first and second pressure chambers can be so controlled that the mounting load may be greater, or smaller, than the total weight of the suction nozzle and one or more members which is or are moved as a unit with the nozzle.

(5) According to a fifth feature of the present invention that includes the second or third features (2) or (3), the nozzle holder comprises, as the one pressure chamber, a first pressure chamber which is defined by the one of the opposite end surfaces of the piston and the housing, and additionally comprises a second pressure chamber which is defined by the other end surface of the piston and the housing and whose pressure is maintained at a predetermined value, and the pressure controller controls the pressure of the gas supplied to the first pressure chamber.

Though the present EC mounting head has the first and second pressure chambers, the pressure controller controls only the first pressure chamber. Therefore, the pressure controller enjoys a simple construction. In the case where the mounting load is greater than the total weight of the suction nozzle and one or more members which is or are moved as a unit with the suction nozzle, it is preferred that the pressure of the first pressure chamber be used to bias the unit in a downward direction; and in the case where the mounting load is smaller than the total, it is preferred that the pressure of the first pressure chamber be used to bias the unit in an upward direction (6) According to a sixth feature of the present invention that includes the second or third features (2) or (3), the nozzle holder comprises, as the one pressure chamber, a first pressure chamber which is defined by the one of the opposite end surfaces of the piston and the housing, and additionally comprises a second pressure chamber which is defined by the other end surface of the piston and the housing and which is communicated with an atmosphere, and the pressure controller controls the pressure of the gas supplied to the first pressure chamber.

In the present EC mounting head, the pressure of the first pressure chamber of the nozzle holder is used to bias the suction nozzle one of opposite directions parallel to the axis line of the nozzle. All of the above explanation made for the fifth feature (5), except the fact that two pressure chambers are formed, (7) According to a seventh feature of the present invention that includes any one of the third to sixth features (3) to (6), one of the two guide surfaces of the nozzle holder that is supported by the piston is formed as a surface of the piston.

In the present EC mounting head, the piston and the housing cooperate with each other to provide the gas bearing. The space provided between the two guide surfaces is small enough to be able to guide the relative movement between the piston and the housing, and the space is supplied with the gas as a lubricant to minimize the resistance to the relative movement between the piston and the housing. Though the gas supplied to the space leaks into at least one of the first and second pressure chambers, the amount of leakage of the gas is too small to adversely influence the control of pressure of the one pressure chamber.

(8) According to an eighth feature of the present invention that includes any one of the third to sixth features (3) to (6), the nozzle holder further comprises a piston rod which projects from the piston and connects the piston to one of the suction nozzle and the support member, and wherein one of the two guide surfaces of the nozzle holder that is supported by the piston is formed as a surface of the piston rod.

In the present EC mounting head, the two guide surfaces are formed on the piston rod and the housing, respectively, and the space provided the two guide surfaces is supplied with the gas to provide, the gas bearing.

BRIEF DESCRIPTION OF DRAWINGS

The above and optional objects, features, and advantages of the present invention will be better understood by reading the following detailed description of the preferred embodiments of the invention, when considered in connection with the accompanying drawings, in which.

DETAILED DESCRIPTION OF PREFERRED EMBODIMENTS

Figure 1:
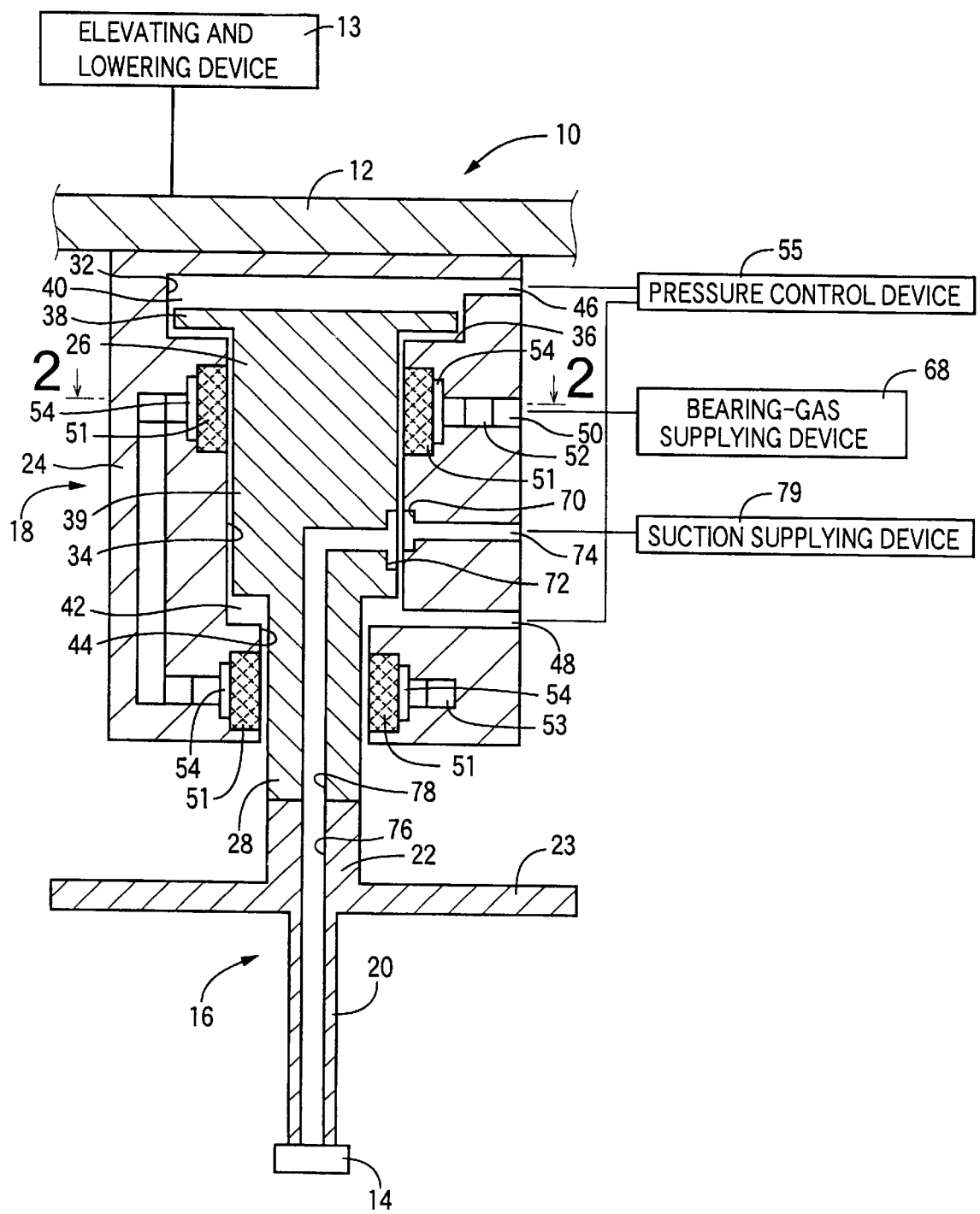
FIG. 1 is a cross-sectioned, schematic front elevation view of an electric-component ("EC") mounting head including a mounting-load control device, as a first embodiment of the present invention.

In FIG. 1, reference numeral 10 designates an electric-component ("EC") mounting head 10 embodying the present invention. The EC mounting head 10 includes a support member 12, a suction nozzle 16 which applies suction to an EC 14 and thereby holds the EC 14, and an air-operated nozzle holder 18 which connects the suction nozzle 16 to the support member 12 such that the nozzle 16 is movable relative to the support member 12 in vertically upward and downward directions parallel to a vertical, central axis line of the nozzle 16. The support member 12 is elevated and lowered by an elevating and lowering device shown in FIG. 1. The suction nozzle 16 includes a cylindrical suction pipe 20, a pipe-hold portion 22, and a back-plate portion 23 which is located between the pipe 20 and the pipe-hold portion 22 and has a diameter greater than that of the pipe-hold portion 22. The suction pipe 20 projects downward from the center of the back-plate portion 23, coaxially with the same 23. The back-plate portion 23 may be one which irradiates, on the side of the pipe-hold portion 22, the EC 14 held by the suction pipe 20, or one which forms a uniform background for the EC 14. The suction pipe 20 may be one which is detachably attached to the pipe-hold portion 22; the pipe-hold portion 22 may be one which is detachably attached to the nozzle holder 18; or the suction pipe 20 and the pipe-hold portion 22 may be ones which are permanently fixed to the nozzle holder 18.

The nozzle holder 18 includes a housing 24, and a piston 26 which is fitted in the housing 24 such that the piston 26 is movable relative to the housing 24. A piston rod 28 projects downward from the piston 26, and the suction nozzle 16 is fixedly held by the piston rod 16.

Figure 2:
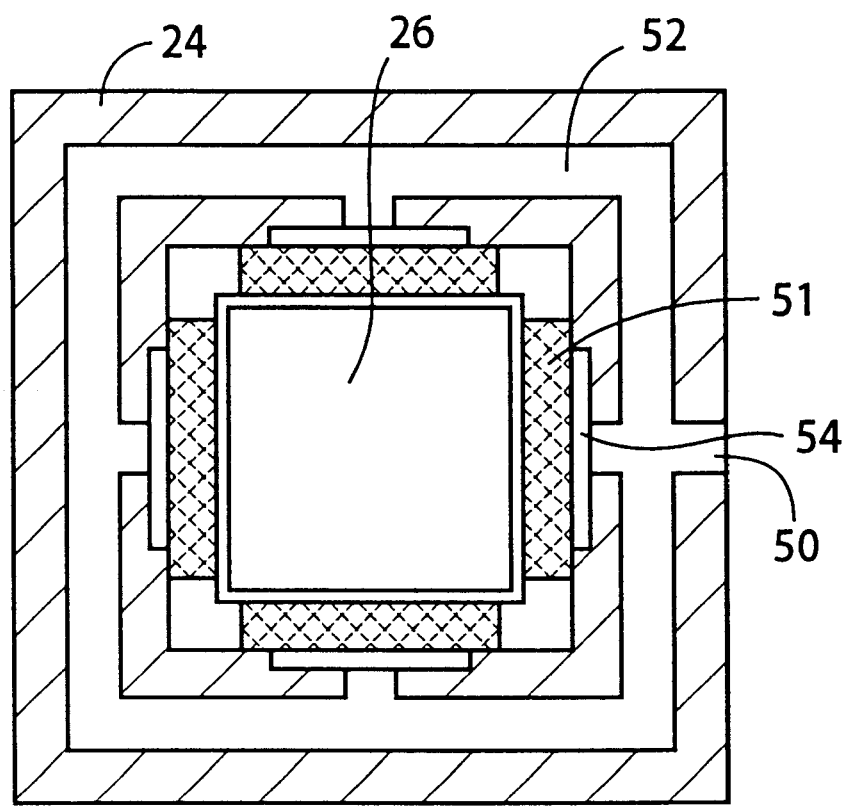
FIG. 2 is a cross-sectioned view taken along line 2—2 in FIG. 1.

An upper end portion of the housing 24 is fixedly held by the support member 12. As shown in FIG. 2, the housing 24 has a rectangular (e.g., square as shown in the figure) transverse cross-sectional shape. As shown in FIG. 1, the housing 24 has a stepped bore including an upper, large rectangular hole 32, and a lower, small rectangular hole 34 whose sides are smaller than those of the large hole 32. The housing 24 has a shoulder surface 36 which is located between the large and small holes 32, 34. The piston 26 has a stepped rectangular-parallelepiped shape including a large rectangular block 38 which is fitted in the large rectangular hole 32, and a small rectangular block 39 which is fitted in the small rectangular hole 34. A lower limit or end of movement of the piston 26 relative to the housing 24 is defined by engagement of the large block 38 of the piston 26 with the shoulder surface 36 of the housing 24.

A space which is left between a vertical, outer side surface of the large block 38 and a vertical, inner wall surface of the large hole 32 in a state in which the large block 38 is fitted in the large hole 32 is greater than a space which is left between a vertical, outer side surface of the small block 39 and a vertical, inner wall surface of the small hole 34 in a state in which the small block 39 is fitted in the small hole 34. The inner space of the housing 24 is separated by the piston 24 into an upper pressure chamber 40 and a lower pressure chamber 42. The piston rod 28 projects downward out of the housing 24 through a through-hole 44 formed through the thickness of the housing 24. A space which is left between a vertical, outer side surface of the piston rod 28 and a vertical, inner wall surface of the through-hole 44 is substantially equal to the space left between the small block 39 and the small hole 34. Thus, the space left between the small hole 34 and the small block 39 and the space left between the through-hole 44 and the piston rod 28 are smaller than the space left between the large hole 32 and the large block 38. Therefore, the large block 38 cannot contact the inner wall surface of the housing 24 that defines the large hole 32. Thus, the outer side surface of the small block 39, the inner wall surface of the small hole 34, the outer side surface of the piston rod 28, and the inner wall surface of the through-hole 44 provide four guide surfaces which guide the movement of the piston 26 relative to the housing 24. No sealing members are provided between the guide surfaces, for minimizing the resistance to the movement of the piston 26 relative to the housing 24.

The upper pressure chamber 40 is communicated with an upper opening 46, and the lower pressure chamber 42 is communicated with a lower opening 48. A bearing-gas supply passage 50 opens in the inner wall surface defining the small hole 34.

Here, the bearing-gas supply passage 50 is described in detail. The supply passage 50 includes a first portion for the small hole 34 and a second portion for the through-hole 44, and the first and second portions are substantially similar to each other. Hence, only the first portion is described in detail, and the description of the second portion is omitted.

As shown in FIG. 2, four porous bodies 51 are provided to surround the small rectangular block 39 of the piston 26. The four porous bodies 51 are embedded in the four inner wall surfaces of the small rectangular hole 34, respectively, in each of which the supply passage 50 opens, such that an inner surface of each of the four porous bodies 51 is flush, and smoothly continuous, with a corresponding one of the four inner wall surfaces of the small hole 34. The supply passage 50 includes a first bearing-gas guide passage 52 which is communicated with four gas-supply chambers 54 formed in rear of the four porous bodies 51 and supplies a bearing bas to the four porous bodies 51 via the respective chambers 54. Like the four porous bodies 51 provided for the small hole 34, additional four porous bodies 51 are embedded in the four inner wall surfaces of the through-hole 44, and a second bearing-gas guide passage 53 of the supply passage 50 is communicated with four gas-supply chambers 54 formed in rear of the porous bodies 51. The first and second guide passages 52, 53 of the supply passage 50 are communicated with each other so that the small hole 34 and the through-hole 44 are supplied with respective bearing gases whose pressures are substantially equal to each other. However, the two guide passages 52, 53 may not be communicated with each other. In the latter case, the second guide passage 53 may be connected to another bearing-gas supply passage which supplies a bearing gas to the second guide passage 53.

In either case, the four porous bodies 51 for each of the small hole 34 and the through-hole 44 are axis-symmetric with one another with respect to a vertical, central axis line of the piston 26. Therefore, when a pressurized bearing air is supplied from an external device to the bearing-gas supply passage 50, the "air" space provided between the small hole 34 and the small block 39 and the "air" space provided between the through-hole 44 and the piston rod 28 are supplied with the pressurized air, at respective positions which are axis-symmetric with one another with respect to the axis line of the piston 26. The pressurized air flows little by little from the two air spaces into the upper and lower pressure chambers 40, 42 and the atmosphere. Thus, four air layers axis-symmetric with one another are formed in each of the two air spaces, so that the four outer surfaces of the small rectangular block 39 are kept in a state in which those outer surfaces do not contact the corresponding inner wall surfaces defining the small rectangular hole 34. It goes without saying that the four outer surfaces of the large rectangular block 38 are kept in a state in which those outer surfaces do not contact the corresponding inner wall surfaces defining the large rectangular hole 32. Therefore, the piston 26 and the housing 24 are positioned relative to each other such that the piston 26 and the housing 24 do not contact each other and are coaxial with each other. The small hole 34, the small block 39, the through-hole 44, the piston rod 28, and the air layers cooperate with one another to provide a gas bearing.

In the present embodiment, an upper limit or end of movement of the piston 26 relative to the housing 24 is defined by butting contact of the large block 38 of the piston 26 on a top wall surface defining the large hole 32. As described previously, the lower end of movement of the piston 26 is defined by the butting contact of the large block 38 on the shoulder surface 36. Even in the state in which the piston 26 is positioned at its lower-end position, the piston 26 does not close the lower opening 48. However, the lower end of movement of the piston 26 may be defined by the butting contact of a lower end surface of the small block 39 on a bottom wall surface defining the small hole 34. In the later case, it is preferred that one of the lower end surface of the small block 39 and the bottom wall surface of the small hole 34 be provided with one or more projections as stoppers which project toward the other of the two surfaces and stop the downward movement of the piston 26, thereby defining the lower-end position of the piston 26, for preventing the piston 26 from closing the lower opening 48.

Figure 3:
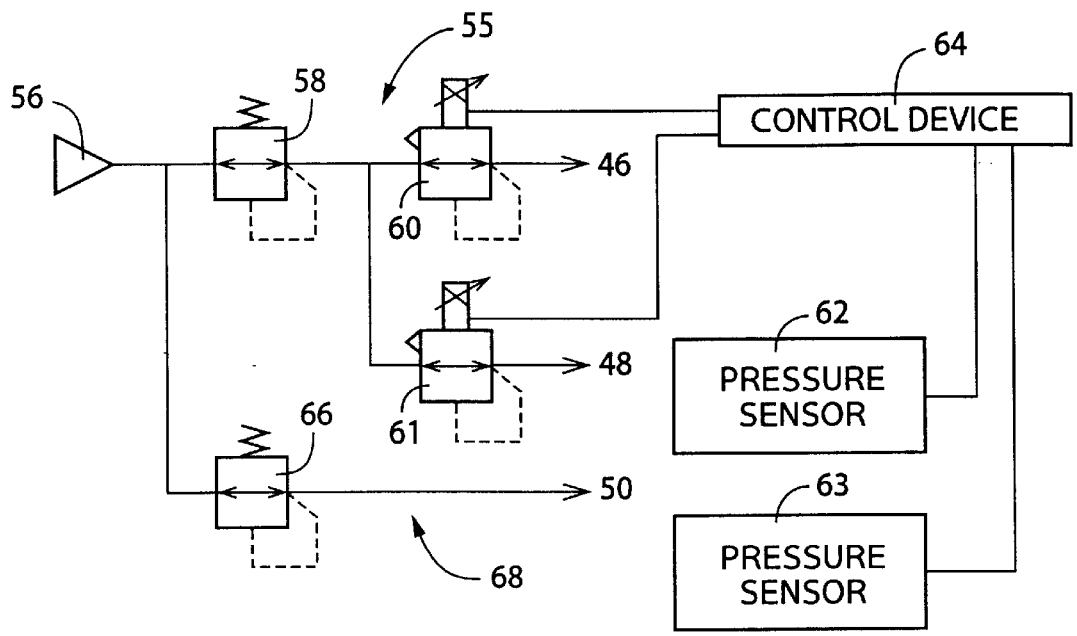
FIG. 3 is a diagrammatic view of a pressure control device and a bearing-gas supplying device of the EC mounting head.

A pressure control device 55, shown in FIG. 3, is connected to each of the upper and lower communication openings 46, 48. The pressure control device 55 controls the pressure of a pressurized gas supplied from a pressurized-gas supplying source 56. The supplying source 56 is, e.g., an air pump which compresses air and supplies the compressed air, or a pressurized-air tap which is provided in a factory. The pressure control device 55 includes a pressure regulator 58 which reduces the pressure of the pressurized gas supplied from the supplying source 56, to a prescribed pressure value; a first pressure-control valve 60 which is connected to the upper pressure chamber 40 via the upper opening 46; and a second pressure-control valve 61 which is connected to the lower pressure chamber 42 via the lower opening 48. The pressure control device 55 additionally includes a control device 64 which controls an electric current supplied to each of the two pressure-control valves 60, 61 and thereby controls the pressure of the pressurized gas supplied from the each valve 60, 61. A first pressure sensor 62 and a second pressure sensor 63 which detect the respective pressures of the upper and lower pressure chambers 40, 42 are connected to the control device 64, and supply respective detection signals representing the detected respective pressures, to the control device 64.

In the present embodiment, each of the two pressure-control valves 60, 61 is provided by a solenoid-operated, proportional control valve device including a relief valve. The control device 64 controls the respective pressures of the two pressure chambers 40, 42 such that a mounting load with which an EC 14 sucked and held by the suction nozzle 16 is mounted on the PWB is equal to an appropriate pressing load which is pre-determined for the sort of the EC 14 and is pre-stored in a memory (e.g., read only memory (ROM)) of the control device 64. The mounting load, F, is expressed as follows: $F = P_{40} \times S_{40} - P_{42} \times S_{42} + W$ $[(P_{40}-P_{42}) \times S + W]$, where $P_{40}$ is the pressure of the upper chamber 40; $P_{42}$ is the pressure of the lower chamber 42; $S_{40}$ is a transverse cross-section area of the rectangular block 38 of the piston 26; $S_{42}$ is a transverse cross-section area of the small rectangular block 39 of the piston 26 minus a transverse cross-section area of the piston rod 28 [S is a transverse cross-section area of the small rectangular block 39 of the piston 26]; and W is the total weight of the piston 26, the suction nozzle 16, and the EC 14. The weight of the EC 14 may be neglected. In the case where the pressure $P_{40}$ of the upper chamber 40 is higher than the pressure $P_{42}$ of the lower chamber 42, the mounting load F is greater than the weight W. In the case where the pressure $P_{40}$ of the upper chamber 40 is lower than the pressure $P_{42}$ of the lower chamber 42, the mounting load F is smaller than the weight W. The control device 64 reads, from the memory, an appropriate mounting load corresponding to the sort of EC 14 to be mounted next, determines, based on the thus read appropriate mounting load, the respective pressures $P_{40}$, $P_{42}$ of the upper and lower chambers 40, 42, and controls the respective electric currents supplied to the pressure-control valves 60, 61 so that the respective pressures detected by the pressure sensors 62, 63 are equal to the determined pressures $P_{40}$, $P_{42}$ of the upper and lower chambers 40, 42.

The bearing-gas supply passage 50 is connected to the pressurized-gas supplying source 56 via a pressure regulator 66. Thus, the pressurized gas is always supplied from the pressure regulator 66 via the supply passage 50 to the space provided between the above-indicated two guide surfaces of the piston 26 and the housing 24, so that the piston 26 and the housing 24 are moved relative to each other with a small resistance. In the present embodiment, the bearing-gas supply passage 50, the pressure regulator 66, and the pressurized-gas supplying source 56 cooperate with one another to provide a bearing-gas supplying device 68. However, in the case where the supplying source 56 is the pressurized-gas tap provided in the factory, the supplying device 68 does not include the supplying source 56, but includes a connector which connects between the pressure regulator 66 and the tap.

A first elongate hole 70 is formed in the inner wall surface defining the small rectangular hole 34, such that the first elongate hole 70 extends in an axial direction of the housing 24. A second elongate hole 72 is formed in the outer surface of the small rectangular block 39, such that the second elongate hole 72 faces the first elongate hole 70 and extends in an axial direction of the piston 26. The second hole 72 has a length which assures that whichever position the piston 26 may take relative to the housing 24, the second hole 72 is kept communicated with the first hole 70 and is not communicated with the lower opening 48. A communication opening 74 which opens in the outer surface of the housing 24, is communicated to the first elongate hole 70, and the second elongate hole 72 is communicated with respective suction passages 76, 78 which are formed in the piston rod 28 and the suction nozzle 16. A suction (i.e., negative pressure) supplying device 79 is connected to the communication opening 74, so that a suction or a negative pressure is supplied to the suction pipe 20. The suction supplying device 79 includes a direction switch valve device which selectively connects the opening 74 to a suction supplying source, a positive-pressure supplying source, or the atmosphere.

Next, there will be described an EC mounting operation which is performed by the present EC mounting head 10 which is provided with a mounting-load control device.

An operator operates an control panel (not shown) of the control device 64 to command the EC mounting head 10 to start an operation for mounting an EC on a PWB as an object. First, the suction nozzle 16 sucks and holds the EC 14, and the head 10 moves the EC 14 to an EC-mount position. As described previously, the support member 12 is held by the elevating and lowering device, which is moved by an X-Y robot to an arbitrary position on a plane perpendicular to the axis line of the suction nozzle 16, so that the suction nozzle 16 is positioned at the EC-mount position. However, the suction nozzle 16 may be held by an intermittently rotatable, index table, and may be positioned at a predetermined EC-mount position. In the latter case, the PWB may be moved to an arbitrary position by an X-Y table.

The control device 64 reads, from the memory, an appropriate mounting load corresponding to the sort of the current EC 14 and the sort of the current PWB, and determines, based on the thus read mounting load, the respective target pressures of the upper and lower pressure chambers 40. Then, the control device 64 controls the respective current pressures of the upper and lower pressure chambers 40, 42 so as to be equal to the thus determined target pressures, respectively. In a state before the EC 14 held by the suction nozzle 16 contacts the PWB, the downward biasing force corresponding to the appropriate mounting load is received by the shoulder surface 36, so that the piston 26 and the suction nozzle 16 are kept at their lower-end or lower-limit position relative to the housing 24.

Then, the EC mounting head 10 is lowered by the elevating and lowering device, so that the EC 14 contacts the PWB. In at least a time duration immediately before the EC 14 contacts the PWB, the head 10 is lowered at a sufficiently low speed, so that at the time the EC 14 contacts the PWB, the pressing load with which the EC 14 is pressed against the PWB is prevented from being substantially increased by the inertia force of the head 10. After the EC 14 contacts the PWB, the support member 12 is further lowered to a prescribed position. As a result, the volume of the lower pressure chamber 42 increases and the volume of the upper pressure chamber 40 decreases. Notwithstanding the respective changes of the two volumes, the respective pressures of the two pressure chambers 40, 42 are kept at the above-described target pressures, respectively. For example, if the volume of the upper pressure chamber 40 decreases so that the pressure of the same 40 may exceed the target pressure determined therefor, an excessive gas is released through the relief valve of the pressure control valve 60, so that notwithstanding the change of the volume of the pressure chamber 40, the pressure of the same 40 is kept at the target pressure. Thus, the EC 14 is pressed on the PWB with the appropriate mounting load, and is fixed to the PWB with a fixing agent, such as an adhesive or a solder paste, which is applied in advance to the PWB. In this way, the EC mounting head 10 is lowered while the mounting load is maintained at the appropriate value. Therefore, it is not needed to accurately determine the lower-end position of the head 10. In other words, the lower-end position of the head 10 may be determined at any position where the great rectangular block 38 is separate from the shoulder surface 36 and from the top wall surface defining the great rectangular hole 32.

After the EC 14 is fixed to the PWB, the supplying of the suction (i.e., negative pressure) to the suction nozzle 16 is stopped or cut. Then, the support member 12 is moved upward. During an initial portion of this upward movement, the nozzle 16 continues contacting the EC 14 fixed to the PWB. Subsequently, the large rectangular block 38 of the piston 26 contacts the shoulder surface 36 of the housing 24 and, then, the nozzle 16 is moved upward together with the support member 12 while being moved away from the EC 14. Thereafter, the EC mounting head 10 is moved to an EC-receive position where the head 10 will receive another EC 14. Thus, one EC mounting operation is finished.

In the present embodiment, both the inner surface of the small rectangular hole 34 of the housing 24 and the outer surface of the small rectangular block 39 of the piston 26, and the inner surface of the through-hole 44 of the housing 24 and the outer surface of the piston cylinder 28 provide two pairs of guide surfaces which guide the movement of the piston 26. However, it is possible to employ only one pair of guide surfaces, which may be provided by either the inner surface of the small rectangular hole 34 and the outer surface of the small rectangular block 39, or the inner surface of the through-hole 44 and the outer surface of the piston cylinder 28. In the latter case, it is preferred that the space provided between the pair of inner and outer surfaces which do not provide the one pair of guide surfaces be greater than the space provided between the pair of inner and outer surfaces which provide the one pair of guide surfaces, and that an axial length of the former space be shorter than an axial length of the latter space, so that the housing 24 and the piston 26 may not contact each other through the latter pair of inner and outer surfaces. In addition, the suction passage 78 may be connected to the suction or negative-pressure supplying device 79 via either the former space or the latter space. Otherwise, the suction passage 78 may be connected to the suction supplying device 79 via a receiving hole 84, shown in FIG. 4, which is formed through the thickness of the wall of the housing 24.

In each of the illustrated embodiments, the cross-sectional shape of each of the housing 24 and the piston 26 is rectangular. However, each of the housing 24 and the piston 26 may have a different cross-sectional shape than the rectangular shape; such as a circular or triangular shape.

In the illustrated embodiment, the nozzle holder 18 is held by the support member 12 such that the housing 24 of the holder 18 is fixed to the same 12. However, it is possible to fix the piston 26 to the support member 12 such that the housing 24 is movable relative to the piston 26 and the support member 12. In the latter case, the suction nozzle 14 is held by the housing 24. In addition, a gas-supply passage for supplying gas to each of the two pressure chambers 40, 42 and the space provided between each pair of guide surface may be formed in the piston 26.

In each of the illustrated embodiments, the control device 64 controls the respective electric currents supplied to the two pressure control valves 60, 61 so that the respective pressures detected by the two pressure sensors 62, 63 may be equal to the target pressure values $P_{40}$, $P_{42}$ determined by the control device 64. However, it is possible to omit the pressure sensors 62, 63. In the latter case, the control device 64 may control the respective electric currents supplied to the two pressure control valves 60, 61, based on the weight of the piston 26, the nozzle 16, etc. and a target (i.e., appropriate) mounting load.

Figure 4:
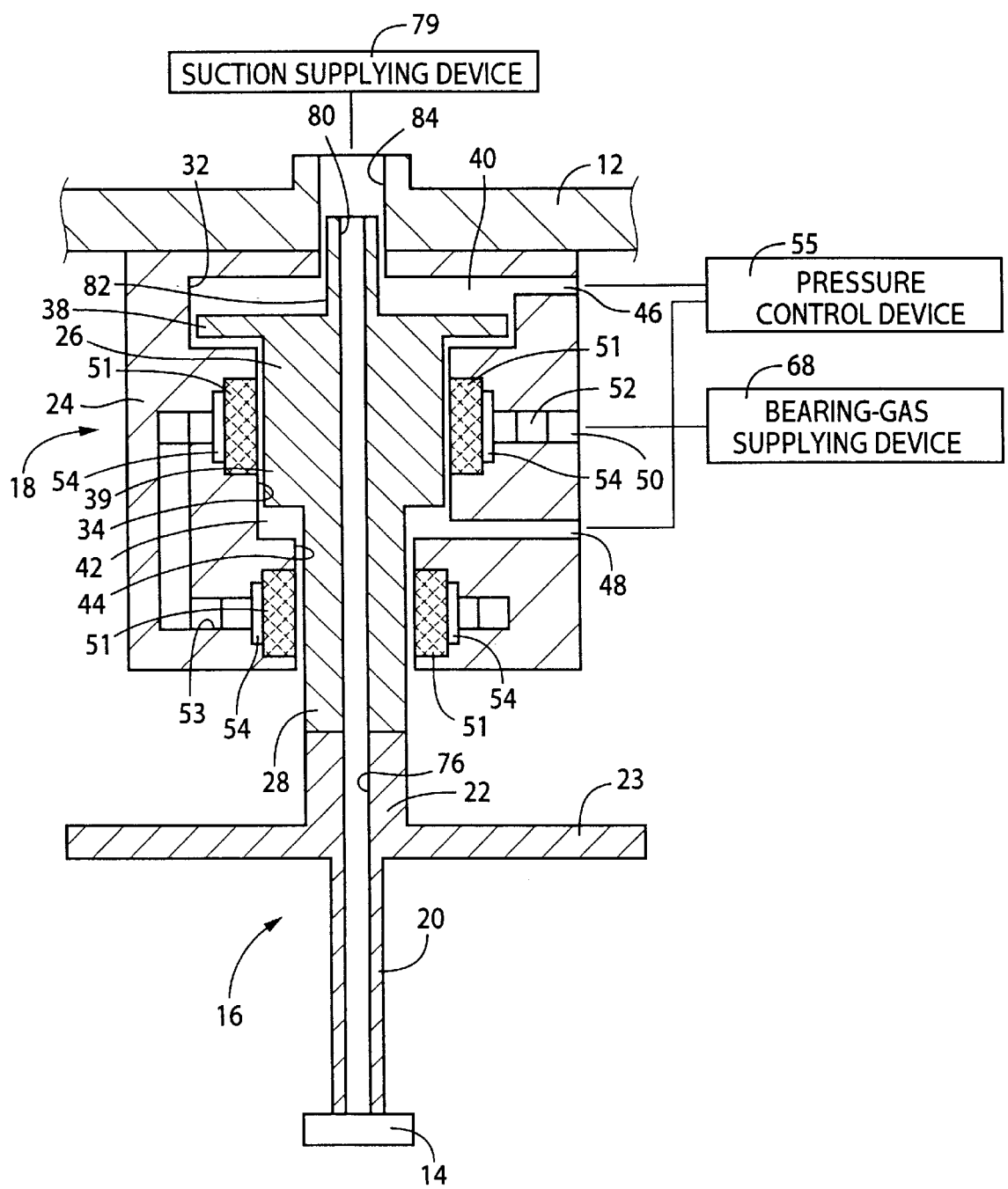
FIG. 4 is a cross-sectioned, schematic front elevation view of another EC mounting head as a second embodiment of the present invention.

In each of the illustrated embodiments, the suction passage 76 of the suction nozzle 16 is connected to the suction supplying device 79 via the space provided between the small rectangular hole 34 and the small rectangular block 39. However, it is possible that as shown in FIG. 4, the suction passage 76 be connected to the suction supplying device 79 via a suction passage 80 which axially extends through the piston 26 and the piston rod 28. More specifically described, the suction passage 80 is coaxial with the suction passage 76 of the suction nozzle 16. A projecting portion 82 projects upward from the top surface of the piston 26, so that the projecting portion 82 fits in the receiving hole 84 formed through the top wall of the housing 24 and the support member 12. An upper end of the suction passage 80 opens in a top surface of the projecting portion 82. Here, it is required that an outer surface of the projecting portion 82 and an inner wall surface defining the receiving hole 84 do not contact each other and that a space provided between the outer and inner surfaces be so small as to provide a substantial airtightness. In addition, it is needed to determine an axial length of the projecting portion 82 such that even when the piston 26 is positioned at its lower-end position, the projecting portion 82 does not completely come out of the receiving hole 84. The receiving hole 84 is connected to the suction supplying device 79. Thus, the suction can be supplied from the supplying device 79 to the suction nozzle 16, irrespective of which position the piston 26 is currently taking. In a state in which the suction is supplied to the receiving hole 84, the piston 26 receives an upward force equal to the product of the negative pressure of the suction and the cross-section area of the projecting portion 82. Therefore, it is preferred that the control device 64 take this fact into account when determining the respective target pressures of the two pressure chambers 40, 42. In addition, in order to minimize the influence resulting from the fluctuation of the upward force, it is also preferred that the outer diameter of the projecting portion 82 be as small as possible.

Figure 5:
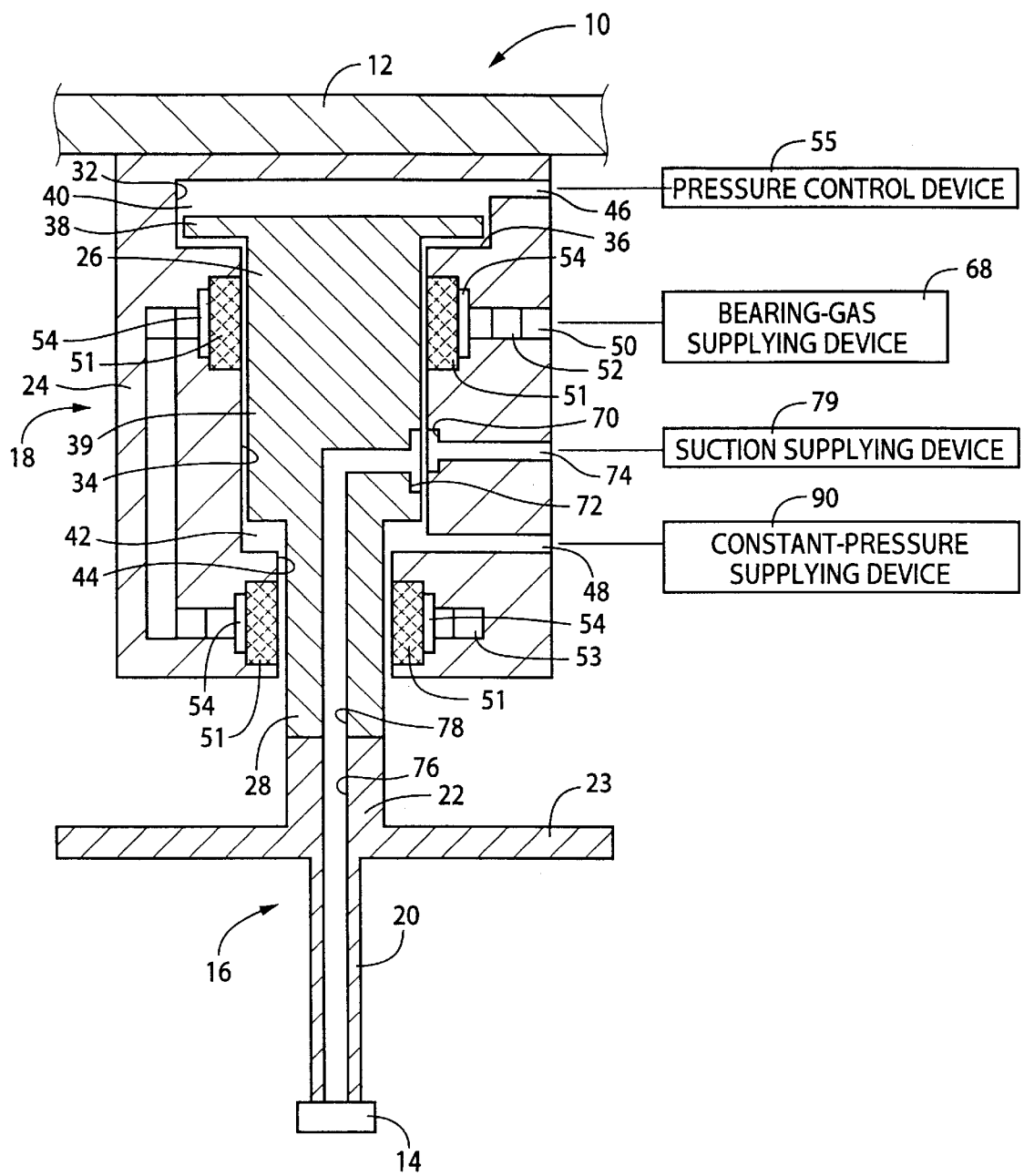
FIG. 5 is a cross-sectioned, schematic front elevation view of another EC mounting head as a third embodiment of the present invention.
Figure 6:
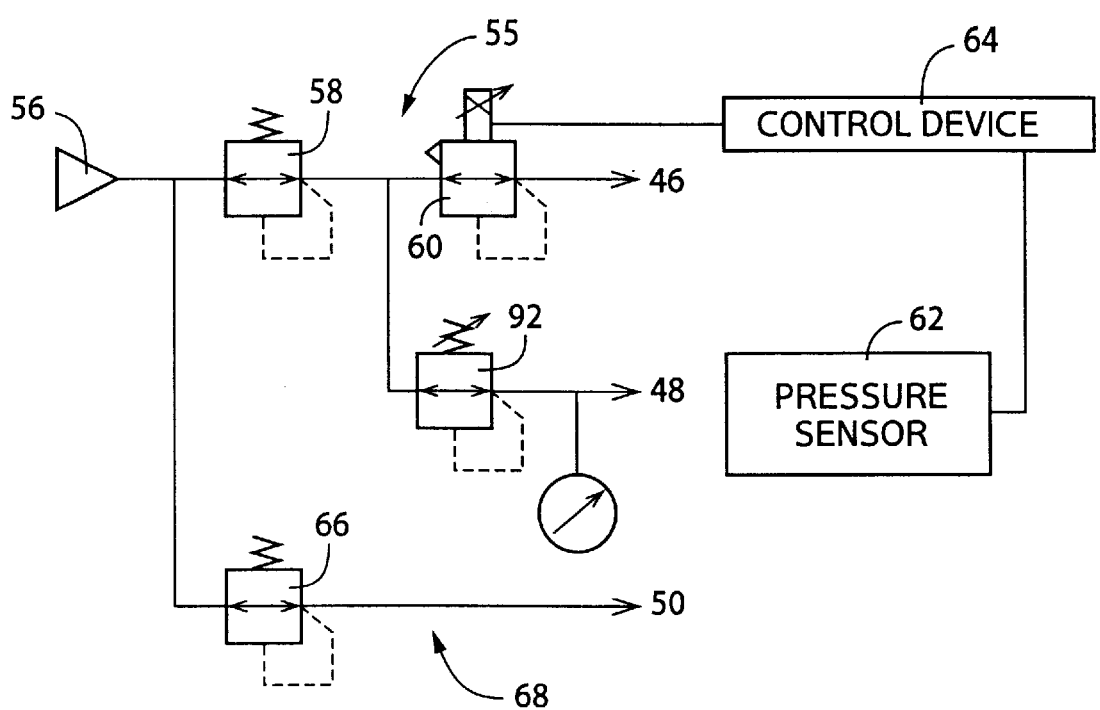
FIG. 6 is a diagrammatic view of a pressure control device and a bearing-gas supplying device of the EC mounting head of FIG. 5.

FIGS. 5 and 6 show another EC mounting head as a third embodiment of the present invention that is basically similar to the EC mounting head 10 shown in FIGS. 1 to 3 but is different from the head 10 in that a pressure in the lower pressure chamber 42 is not controlled by the pressure control device 55 and the lower pressure chamber 42 is supplied with a constant pressure from a constant-pressure supplying device 90, which includes a manually adjustable valve 92 which is manually adjustable by an operator to adjust or change the pressure of pressurized gas supplied to the lower pressure chamber 42. Thus, the pressure of the lower pressure chamber 42 is kept at the constant pressure adjusted by the operator.

Figure 7:
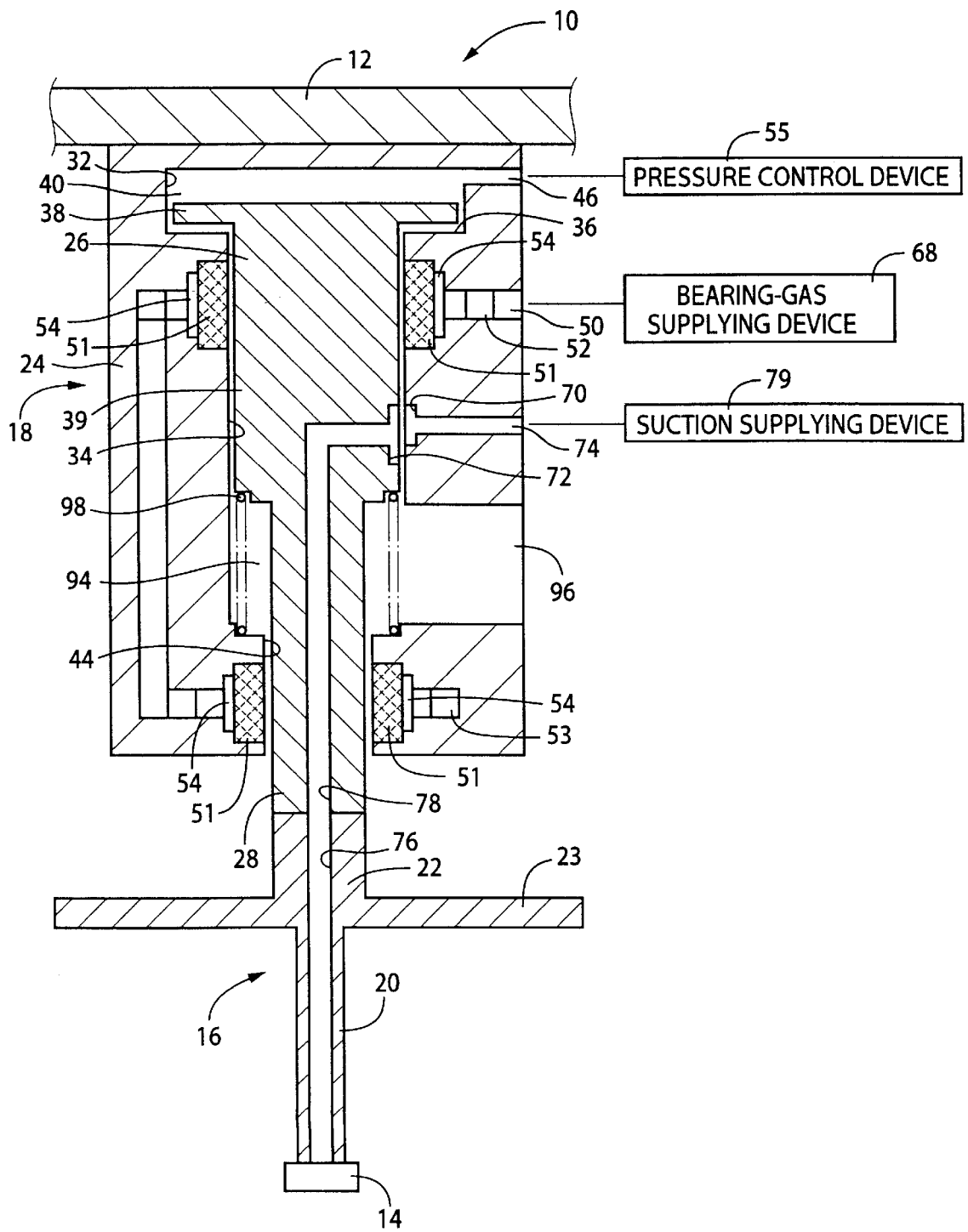
FIG. 7 is a cross-sectioned, schematic front elevation view of another EC mounting head as a fourth embodiment of the present invention.
Figure 8:
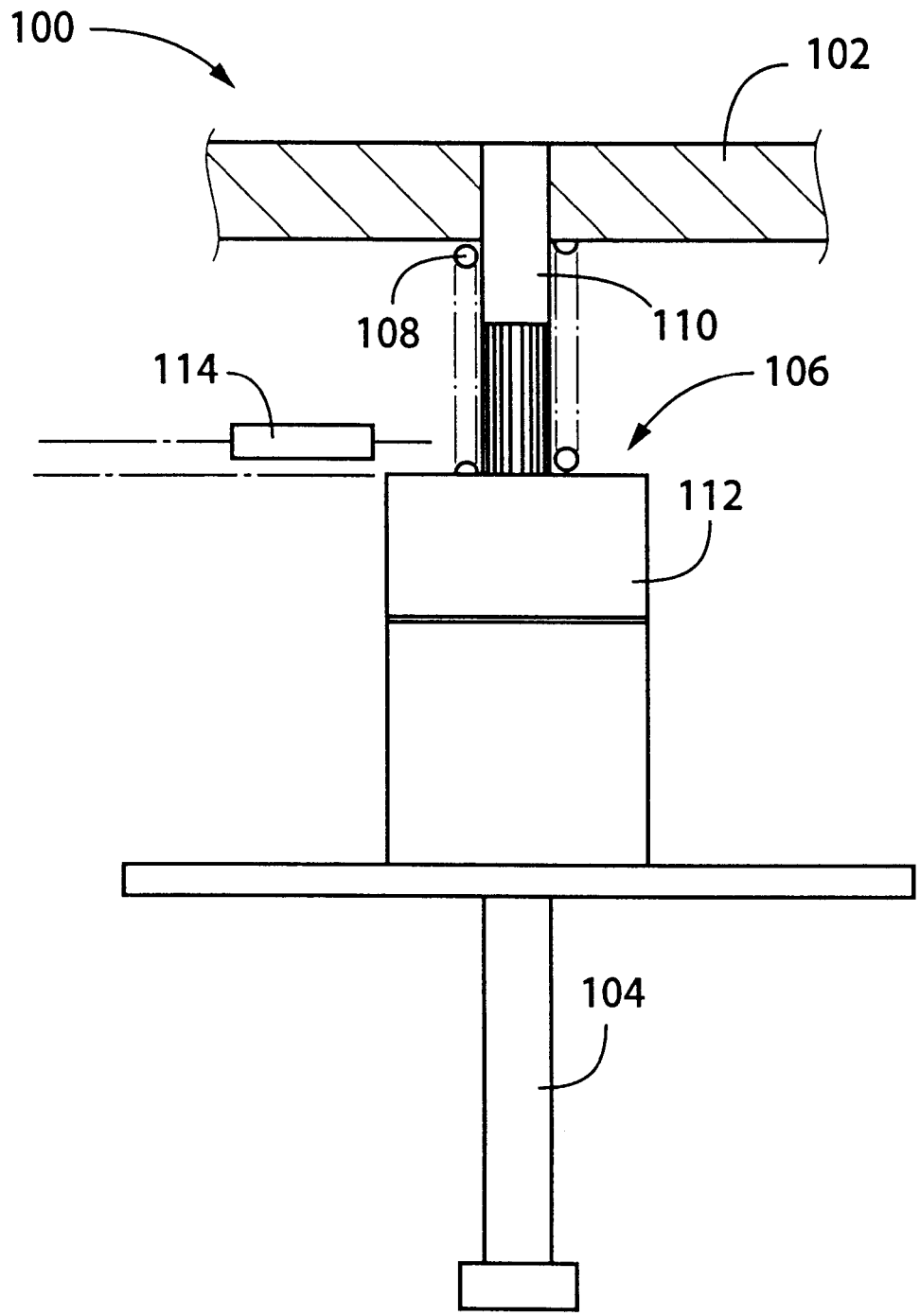
FIG. 8 is a cross-sectioned, schematic front elevation view of a conventional EC mounting head.

FIG. 7 shows another EC mounting head as a fourth embodiment of the present invention that is basically similar to the EC mounting head 10 shown in FIGS. 1 to 3 but is different from the head 10 in that a lower pressure chamber 94 is communicated with the atmosphere via an opening 94 and a coil spring 98 is provided between a lower end surface of the piston 26 and a bottom wall surface defining the lower chamber 94.

While the present invention has been described in its preferred embodiments, the present invention is not limited to the features described in SUMMARY OF INVENTION and the features described in PREFERRED EMBODIMENTS OF INVENTION, but may be embodied with other changes, improvements, and modifications that may occur to a person skilled in the art without departing from the scope and spirit of the invention defined in the appended claims.

What is claimed is:

1. An electric-component mounting head, comprising:

a support member;

a suction nozzle which applies a suction to an electric component and thereby holds the electric component; and a nozzle holder which is supported by the support member, which holds the suction nozzle such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having (a) at least one pressure chamber which is defined by at least one of axially opposite end surfaces of the piston and the housing, (b) at least one first communication opening which communicates with said at least one pressure chamber, (c) two guide surfaces which are supported by the housing and the piston, respectively, and cooperate with each other to guide the relative movement of the housing and the piston, and (d) at least two gas-supply passages which open in a space provided between the two guide surfaces, at at least two first positions axis-symmetric with each other with respect to an axis line of the piston, and at least two second positions which are axis-symmetric with each other with respect to the axis line of the piston and are distant from the first positions in a direction parallel to the axis line of the piston, the gas-supply passages supplying a pressurized gas to said space.

2. A head according to claim 1, wherein at least a first portion of one of the two guide surfaces of the nozzle holder that is supported by the piston is provided by a surface of the piston, and wherein at least one of the gas-supply passages open in the space provided between the two guide surfaces, at at least the first positions corresponding to the surface of the piston.

3. A head according to claim 2, wherein the nozzle holder further comprises a piston rod which projects from the piston and connects the piston to one of the suction nozzle and the support member, and wherein said one of the two guide surfaces of the nozzle holder that is supported by the piston further includes, in addition to the first portion thereof, a second portion which is provided by a surface of the piston rod, and wherein the gas-supply passages open in the space provided between the two guide surfaces, at the first positions corresponding to the surface of the piston and the second positions corresponding to the surface of the piston rod.

4. A head according to claim 1, wherein said one of the housing and the piston that is connected to the suction nozzle has a suction passage which communicates, at one of opposite ends thereof, with the suction nozzle to supply the suction to the nozzle, and communicates, at the other end thereof, with the space provided between the two guide surfaces, at a third position between the first positions and the second positions in the direction parallel to the axis line of the piston, and wherein said other of the housing and the piston that is connected to the support member has a second communication opening which communicates with said space, at a fourth position between the first positions and the second positions in the direction parallel to the axis line of the piston, so as to communicate with the suction passage via said space and thereby supply the suction to the suction nozzle via said space and the suction passage.

5. A head according to claim 4, wherein no sealing members are provided in the space which is provided between the two guide surfaces and with which each of the suction passage and the second communication opening communicates.

6. A head according to claim 1, wherein said one of the housing and the piston that is connected to the suction nozzle has a suction passage which communicates, at one of opposite ends thereof, with the suction nozzle to supply the suction to the nozzle, and communicates, at the other end thereof, with the space provided between the two guide surfaces, wherein said other of the housing and the piston that is connected to the support member has a second communication opening which communicates with said space and the suction passage to supply the suction to the suction nozzle via said space and the suction passage, and wherein the head further comprises a suction supplying device which is connected to the second communication opening of said other of the housing and the piston that is connected to the support member, so as to supply the suction to the suction nozzle via said space and the supply passage, and which is not directly connected to the suction nozzle.

7. A head according to claim 1, wherein no sealing members are provided between the housing and the piston.

8. An electric-component mounting apparatus, comprising:
   a support member;
   a suction nozzle which applies a suction to an electric component and thereby holds the electric component;
   a mounting-load control device which controls a mounting load with which the suction nozzle presses the electric component against an object when the suction nozzle mounts the electric component on the object, the mounting-load control device including (a) a nozzle holder which connects the suction nozzle to the support member such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having at least one pressure chamber which is defined by at least one of axially opposite end surfaces of the piston and the housing, and having two guide surfaces which are supported by the housing and the piston, respectively, and cooperate with each other to guide the relative movement of the housing and the piston, and (b) a pressure controller which controls a pressure of a gas which is supplied to said at least one pressure chamber of the nozzle holder, and thereby controls the mounting load; and an elevating and lowering device which lowers the support member and thereby moves the suction nozzle downward to mount the electric component on the object, and elevates the support member and thereby moves the suction nozzle upward away from the component mounted on the object.

9. A head according to claim 8, further comprising a gas supplying device which supplies a gas to a space provided between the two guide surfaces of the nozzle holder, wherein the gas supplying device and the two guide surfaces cooperate with each other to provide a gas bearing.

10. A head according to claim 8, wherein the nozzle holder comprises, as said at least one pressure chamber, a first pressure chamber which is defined by said one of the opposite end surfaces of the piston and the housing, and additionally comprises a second pressure chamber which is defined by the other end surface of the piston and the housing, and wherein the pressure controller controls each of the pressure of the gas supplied to the first pressure chamber and a pressure of a gas supplied to the second pressure chamber.

11. A head according to claim 8, wherein the nozzle holder comprises, as said at least one pressure chamber, a first pressure chamber which is defined by said one of the opposite end surfaces of the piston and the housing, and additionally comprises a second pressure chamber which is defined by the other end surface of the piston and the housing and whose pressure is maintained at a predetermined value, and wherein the pressure controller controls the pressure of the gas supplied to the first pressure.

12. A head according to claim 8, wherein the nozzle holder comprises, as said at least one pressure chamber, a first pressure chamber which is defined by said one of the opposite end surfaces of the piston and the housing, and additionally comprises a second pressure chamber which is defined by the other end surface of the piston and the housing and which is communicated with an atmosphere, and wherein the pressure controller controls the pressure of the gas supplied to the first pressure chamber.

13. A head according to claim 8, wherein the elevating and lowering device lowers the support member at a sufficiently low speed which assures that the mounting load is prevented from being substantially increased by an inertial force of the suction nozzle, said one of the housing and the piston that is connected to the suction nozzle, and the electric component.

14. A head according to claim 8, wherein the elevating and lowering device elevates the support member such that during an initial portion of the upward movement of the support member, the suction nozzle continues contacting the electric component mounted on the object.

15. An electric-component mounting head, comprising:

a support member;

a suction nozzle which applies a suction to an electric component and thereby holds the electric component; and a nozzle holder which is supported by the support member, which holds the suction nozzle such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having (a) at least one pressure chamber which is defined by at least one of the axially opposite end surfaces of the piston and the housing, (b) at least one communication opening which communicates with said at least one pressure chamber, (c) two guide surfaces which are supported by the housing and the piston, respectively, and cooperate with each other to guide the relative movement of the housing and the piston, and (d) a gas-supply passage which opens in a space provided between the two guide surfaces, at at least two positions axis-symmetric with each other with respect to an axis line of the piston, and supplies a pressurized gas to said space, said one of the housing and the piston that is connected to the suction nozzle including a first engaging portion provided to one of axially opposite end portions thereof, and having a suction passage which communicates, at one of opposite ends thereof, with the suction nozzle to supply the suction to the nozzle, and opens, at the other end thereof, in a surface of the first engaging portion, said other of the housing and the piston that is connected to the support member including a second engaging portion which has a communication hole and is substantially gas-tightly engaged with the first engaging portion so that the communication hole communicates with the suction passage to supply the suction to the suction nozzle via the passage.

16. An electric-component mounting head, comprising:

a support member;

a suction nozzle which applies a suction to an electric component and thereby holds the electric component; and a mounting-load control device which controls a mounting load with which the suction nozzle presses the electric component against an object when the suction nozzle mounts the electric component on the object, the mounting-load control device including (a) a nozzle holder which connects the suction nozzle to the support member such that the suction nozzle is movable relative to the support member in a direction parallel to an axis line of the suction nozzle, and which comprises a housing and a piston fitted in the housing such that one of the housing and the piston that is connected to the suction nozzle is movable relative to the other of the housing and the piston that is connected to the support member, the nozzle holder having a first pressure chamber which is defined by one of axially opposite end surfaces of the piston and the housing, and a second pressure chamber which is defined by the other end surface of the piston and the housing, and having two guide surfaces which are supported by the housing and the piston, respectively, and cooperate with each other to guide the relative movement of the housing and the piston, and (b) a pressure controller which controls a pressure of a gas which is supplied to each of the first and second pressure chambers of the nozzle holder, and thereby controls the mounting load.

17. A head according to claim 16, wherein the pressure controller determines, based on a pre-determined mounting load, respective target gas pressures in the first and second pressure chambers, according to a following expression:

$$F = P_{40} \times S_{40} - P_{42} \times S_{42} + W,$$

where F is the mounting load; $P_{40}$ is the target gas pressure in the first pressure chamber; $S_{40}$ is a transverse cross-section area of a first portion of the piston that defines the first pressure chamber; $P_{42}$ is the target gas pressure in the second pressure chamber; $S_{42}$ is a transverse cross-section area of a second portion of the piston that defines the second pressure chamber; and W is a total weight of the suction nozzle, said one of the housing and the piston that is connected to the suction nozzle, and the electric component.

* * * * *